US011423929B1

(12) United States Patent
Sapozhnikov et al.

(10) Patent No.: US 11,423,929 B1
(45) Date of Patent: Aug. 23, 2022

(54) READER WITH WIDE SYNTHETIC ANTIFERROMAGNETIC STRUCTURE OPTIMIZED FOR HIGH STABILITY AND LOW NOISE

(71) Applicant: Seagate Technology LLC, Fremont, CA (US)

(72) Inventors: Victor Sapozhnikov, Minnetonka, MN (US); Taras Grigorievich Pokhil, Arden Hills, MN (US); Andrzej Adam Stankiewicz, Edina, MN (US); Mohammed Shariat Ullah Patwari, Edina, MN (US)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 17/392,627

(22) Filed: Aug. 3, 2021

Related U.S. Application Data

(60) Provisional application No. 63/070,085, filed on Aug. 25, 2020.

(51) Int. Cl.
| | |
|---|---|
| *G11B 5/39* | (2006.01) |
| *G11B 5/31* | (2006.01) |
| *G01R 33/09* | (2006.01) |
| *H01L 43/02* | (2006.01) |
| *H01L 43/08* | (2006.01) |
| *H01L 43/12* | (2006.01) |
| *H01F 10/32* | (2006.01) |

(52) U.S. Cl.
CPC .......... *G11B 5/3912* (2013.01); *G01R 33/093* (2013.01); *G11B 5/3163* (2013.01); *G11B 5/3906* (2013.01); *G11B 5/398* (2013.01); *H01F 10/3272* (2013.01); *H01L 43/02* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | | |
|---|---|---|---|---|
| 7,952,839 | B2 * | 5/2011 | Yamazaki | G11B 5/398 360/324.1 |
| 8,582,249 | B2 | 11/2013 | Sapozhnikov et al. | |
| 8,822,046 | B2 | 9/2014 | Singleton et al. | |

(Continued)

OTHER PUBLICATIONS

Krishnia, S., et al., "Role of RKKY torque on domain wall motion in synthetic antiferromagnetic nanowires with opposite spin Hall angles", Scientific Reports, DOI:10.1038/s41598-017-11733-9, dated Sep. 15, 2017, 11 pages.

*Primary Examiner* — Jefferson A Evans
(74) *Attorney, Agent, or Firm* — Westman, Champlin & Koehler, P.A.

(57) ABSTRACT

A reader includes a bearing surface and a free layer having a front surface that forms a portion of the bearing surface. The reader also includes a synthetic antiferromagnetic (SAF) structure below the free layer, the SAF structure has a narrow portion with a front surface that forms a portion of the bearing surface and a wide portion behind the narrow portion. The reader further includes an antiferromagnetic (AFM) layer in contact with the wide portion of the SAF structure. The SAF structure is configured to prevent switching from one magnetic state to another magnetic state in the wide portion under thermal fluctuations.

20 Claims, 8 Drawing Sheets

(56) References Cited

U.S. PATENT DOCUMENTS

| | | | | |
|---|---|---|---|---|
| 9,041,391 B2* | 5/2015 | Gao | ................... | G01R 33/093 |
| | | | | 324/252 |
| 9,042,062 B2* | 5/2015 | Hong | ................... | G11B 5/3163 |
| | | | | 360/324.11 |
| 9,305,578 B1* | 4/2016 | Singleton | ............. | G11B 5/3932 |
| 9,437,224 B2 | 9/2016 | Singleton et al. | | |
| 9,437,225 B2* | 9/2016 | Quan | ..................... | G11B 5/127 |
| 9,633,679 B2 | 4/2017 | Singleton et al. | | |
| 9,653,102 B1* | 5/2017 | Kief | ...................... | G11B 5/3967 |
| 9,679,589 B2* | 6/2017 | Hassan | ................ | G11B 5/3163 |
| 9,799,357 B1* | 10/2017 | Ding | .................... | G11B 5/3912 |
| 10,157,634 B2* | 12/2018 | Ding | .................... | G11B 5/3932 |
| 10,311,901 B1* | 6/2019 | Le | ........................ | G11B 5/3929 |
| 11,127,422 B1* | 9/2021 | Liu | ....................... | G11B 5/3932 |
| 2001/0006446 A1 | 7/2001 | Aoki et al. | | |
| 2011/0032645 A1 | 2/2011 | Noel et al. | | |
| 2017/0140781 A1* | 5/2017 | Sapozhnikov | ......... | G11B 5/398 |

\* cited by examiner

READER WITH WIDE SYNTHETIC ANTIFERROMAGNETIC STRUCTURE OPTIMIZED FOR HIGH STABILITY AND LOW NOISE

CROSS-REFERENCE TO RELATED APPLICATION

This application claims priority to U.S. Provisional Application No. 63/070,085, filed on Aug. 25, 2020, the content of which is hereby incorporated in its entirety.

SUMMARY

In one embodiment, a reader is provided. The reader includes a bearing surface and a free layer having a front surface that forms a portion of the bearing surface. The reader also includes a synthetic antiferromagnetic (SAF) structure below the free layer, the SAF structure has a narrow portion with a front surface that forms a portion of the bearing surface and a wide portion behind the narrow portion. The reader further includes an antiferromagnetic (AFM) layer in contact with the wide portion of the SAF structure. The SAF structure is configured to prevent switching from one magnetic state to another magnetic state in the wide portion under thermal fluctuations.

In another embodiment, a method of forming a reader is provided. The method includes providing a bearing surface, and providing a free layer having a front surface that forms a portion of the bearing surface. The method also includes providing a synthetic antiferromagnetic (SAF) structure below the free layer. The SAF structure has a narrow portion having a front surface that forms a portion of the bearing surface and a wide portion behind the narrow portion. The method further includes providing an antiferromagnetic (AFM) layer in contact with the wide portion of the SAF structure. Additionally, the method prevents switching from one magnetic state to another magnetic state in the wide portion of the SAF structure by one of canted pinning of a magnetization of the wide portion of the SAF structure or the inclusion of a protrusion between the wide and narrow portions of the SAF structure. The canted pinning includes pinning a magnetization of the wide portion of the SAF structure in contact with the AFM layer in a plane of the SAF structure and at an angle with respect to an axis perpendicular to the bearing surface, the angle having a degree value that prevents the switching from one magnetic state to another magnetic state. Alternatively, the protrusion is formed. The protrusion is from the wide portion the SAF structure and prevents the switching from one magnetic state to another magnetic state in the wide portion of the SAF structure. The protrusion includes a base in contact with a front edge of the wide portion of the SAF structure and a front edge in contact with a rear edge of the narrow portion of the SAF structure. The base of the protrusion has a width that is less than a width of the wide portion of the SAF structure and greater that a width of the front edge of the protrusion.

In yet another embodiment, a reader is provided. The reader includes a bearing surface, and a free layer having a front surface that forms a portion of the bearing surface. The reader also includes a synthetic antiferromagnetic (SAF) structure below the free layer. The SAF structure has a narrow portion that has a front surface that forms a portion of the bearing surface and a wide portion behind the narrow portion. The reader further includes an antiferromagnetic (AFM) layer in contact with the wide portion of the SAF structure. The reader also includes one of two configurations to prevent switching from one magnetic state to another magnetic state in the wide portion of the SAF structure. A first of the two includes a magnetization of the wide portion of the SAF structure in contact with the AFM layer being in a plane of the SAF structure and at an angle with respect to an axis perpendicular to the bearing surface. The angle having a degree value that prevents the switching from one magnetic state to another magnetic state in the wide portion of the SAF structure. The second or alternative configuration include a protrusion from the wide portion the SAF structure. The protrusion is capable of preventing the switching from one magnetic state to another magnetic state in the wide portion of the SAF structure. The protrusion includes a base in contact with a front edge of the wide portion of the SAF structure and a front edge in contact with a rear edge of the narrow portion of the SAF structure. The base has a width that is less than a width of the wide portion of the SAF structure and greater that a width of the front edge of the protrusion.

Other features and benefits that characterize embodiments of the disclosure will be apparent upon reading the following detailed description and review of the associated drawings.

DETAILED DESCRIPTION OF ILLUSTRATIVE EMBODIMENTS

Embodiments described below relate to readers with wide synthetic antiferromagnetic (SAF) structures optimized for higher stability and lower noise. Prior to providing details regarding the different embodiments, a description of an illustrative operating environment is provided below.

Figure 1:
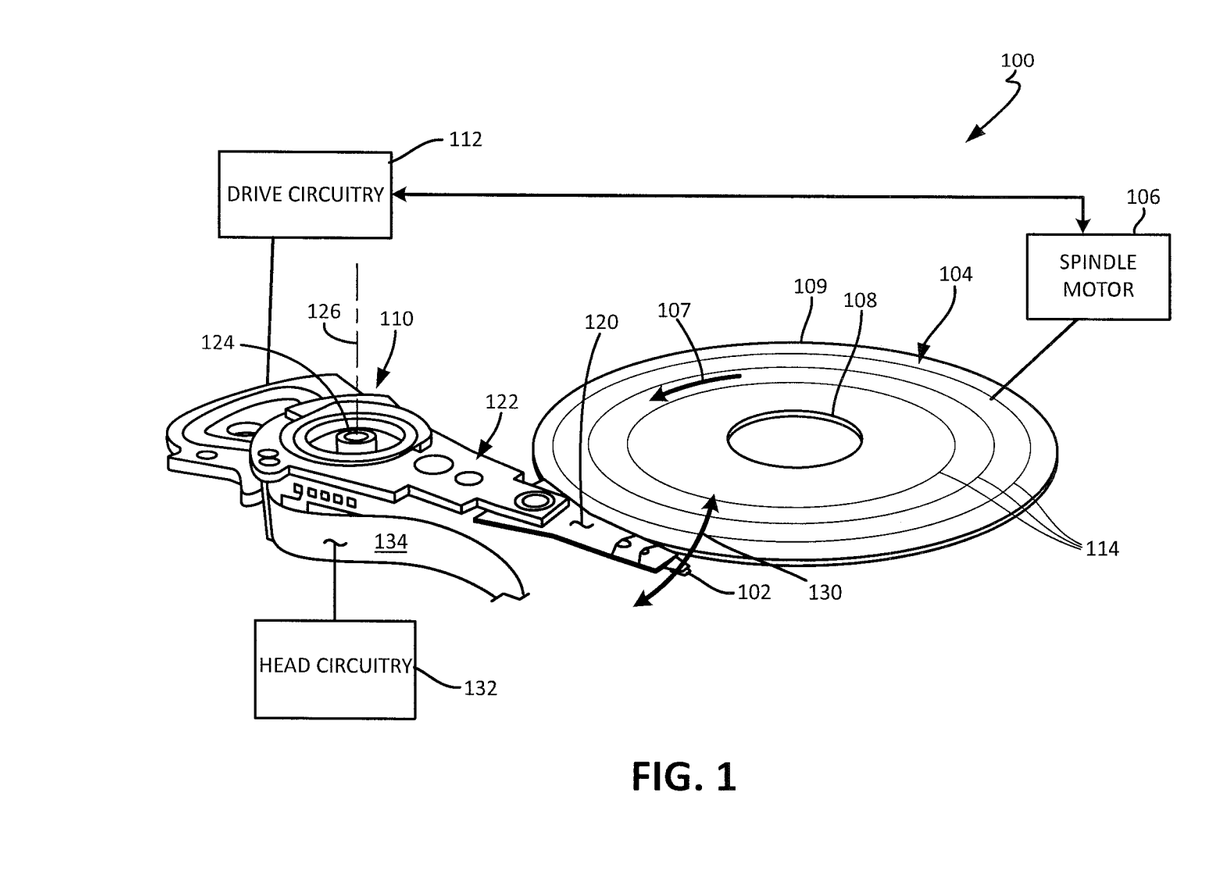
FIG. 1 is a schematic illustration of a data storage system including a data storage medium and a head for reading data from and/or writing data to the data storage medium.

FIG. 1 shows an illustrative operating environment in which certain specific embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1 is a schematic illustration of a data storage device 100 including a data storage medium and a head for reading data from and/or writing data to the data storage medium. Data storage device 100 may be characterized as a hard disc drive (HDD). In data storage device 100, head 102 is positioned above storage medium 104 to read data from and/or write data to the data storage medium 104. In the embodiment shown, the data storage medium 104 is a rotatable disc or other magnetic storage medium that includes a magnetic storage layer or layers. For read and write operations, a spindle motor 106 (illustrated schematically) rotates the medium 104 as illustrated by arrow 107 and an actuator mechanism 110 positions the head 102 relative to data tracks 114 on the rotating medium 104 between an inner diameter 108 and an outer diameter 109. Both the spindle motor 106 and actuator mechanism 110 are connected to and operated through drive circuitry 112 (schematically shown). The head 102 is coupled to the actuator mechanism 110 through a suspension assembly which includes a load beam 120 connected to an actuator arm 122 of the mechanism 110 for example through a swage connection. Although FIG. 1 illustrates a single load beam coupled to the actuator mechanism 110, additional load beams 120 and heads 102 can be coupled to the actuator mechanism 110 to read data from or write data to multiple discs of a disc stack. The actuator mechanism 110 is rotationally coupled to a frame or deck (not shown) through a bearing 124 to rotate about axis 126. Rotation of the actuator mechanism 110 moves the head 102 in a cross track direction as illustrated by arrow 130.

The head 102 includes one or more transducer elements (not shown in FIG. 1) coupled to head circuitry 132 through flex circuit 134. Details regarding elements of a head such as 102 are provided below in connection with FIG. 2.

Figure 2:
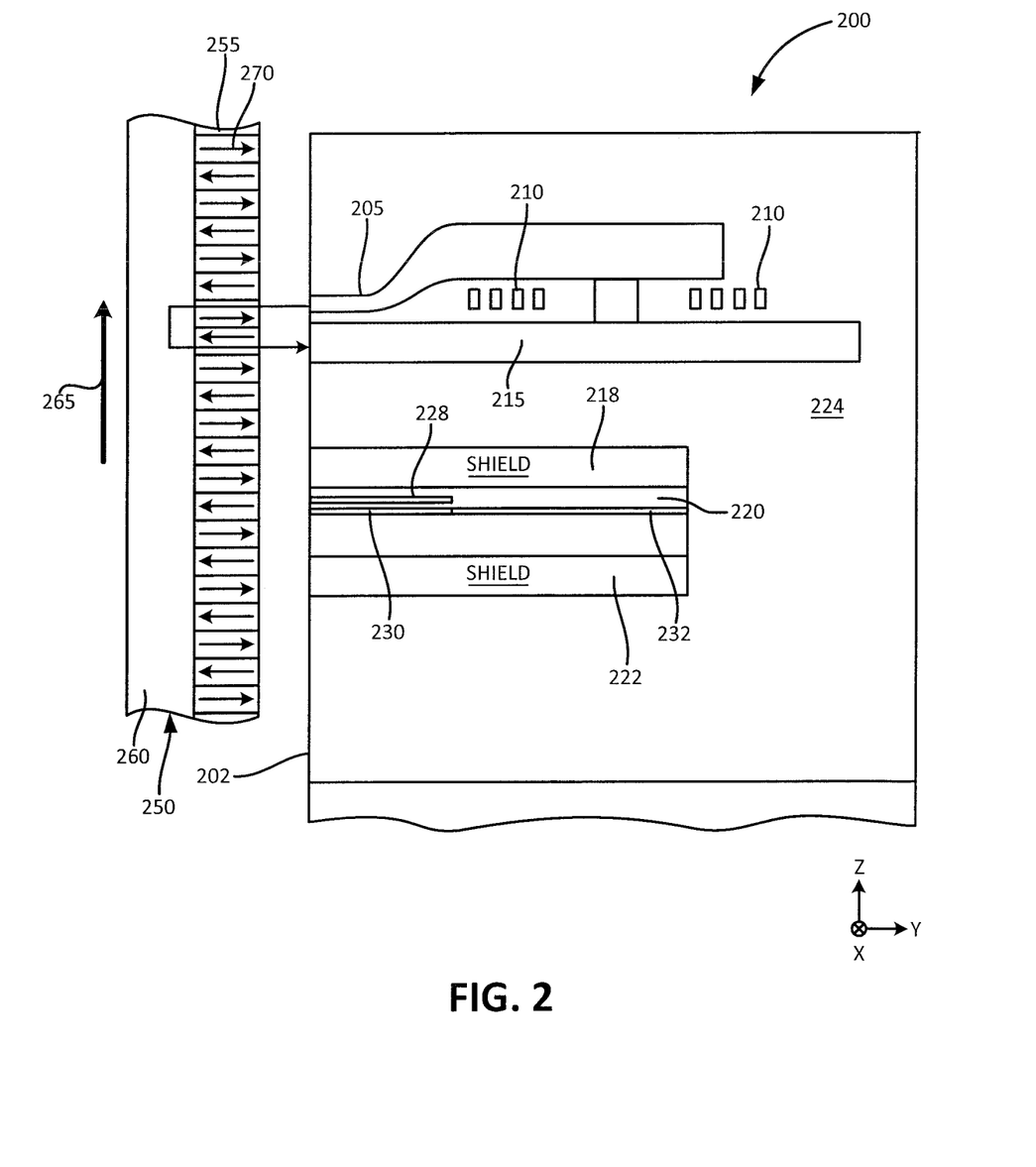
FIG. 2 is a schematic diagram of a cross-section of one embodiment of a recording head that reads from and writes to a storage medium.

FIG. 2 is a schematic diagram showing a cross-sectional view of portions of a recording head 200 and a data storage medium 250 taken along a plane substantially normal to a plane of a bearing surface (for example, an air bearing surface (ABS)) 202 of recording head 200. The recording head elements shown in FIG. 2 are illustratively included in a recording head such as recording head 102 in FIG. 1. Medium 250 is illustratively a data storage medium such as medium 104 in FIG. 1. Those skilled in the art will recognize that recording heads and recording media commonly include other components. Embodiments of the present disclosure are not limited to any particular recording heads or media. Embodiments of the present disclosure may be practiced in different types of recording heads and media.

Layers of recording head 200 may be stacked along a track direction (e.g., a z-direction in FIG. 2). A track width direction is perpendicular to the track direction (e.g., a cross-track direction, which is an x-direction in FIG. 2). A y-direction in FIG. 2 is then defined as a direction that is perpendicular to x and z simultaneously, which is a stripe-height direction. Recording head 200 includes a write pole 205, a magnetization coil 210, a return pole 215, a top shield 218, a read transducer or reader 220, a bottom shield 222, and a wafer overcoat 224. Read transducer 220 includes a free layer 226 that is a primary element for carrying out read operations. Read transducer 220 further includes a synthetic antiferromagnetic (SAF) structure 228 below the free layer 226. As will be described in detail further below, the SAF structure 228 includes a narrow portion 230 directly below the free layer 226 and a wide portion 232 behind the narrow portion 230. It should be noted that widths of narrow portion 230 and wide portion 232 of SAF structure 228 are x-direction widths, which are not visible in FIG. 2. An antiferromagnetic (AFM) layer (not shown in the interest of simplification), which is recessed behind the bearing surface, is positioned such that it is in contact with the wide portion 232 of the SAF structure 228 to pin a magnetization direction of the SAF structure 228.

Storage medium 250 includes a recording layer 255 and an underlayer 260. Storage medium 250 rotates in the direction shown by arrow 265. Arrow 265 is illustratively a direction of rotation such as arrow 107 in FIG. 1.

In an embodiment, electric current is passed through coil 210 to generate a magnetic field. The magnetic field passes from write pole 205, through recording layer 255, into underlayer 260, and across to return pole 215. The magnetic field illustratively records a magnetization pattern 270 in recording layer 255. Read transducer 220 senses or detects magnetization patterns in recording layer 255 with the help of free layer 228, and is used in retrieving information previously recorded to layer 255.

Some read transducers or readers with wide SAF structures and a recessed AFM may suffer from an instability mode and relatively high noise. This problem may be caused by switching from one magnetic state to another magnetic state in the SAF, and is described herein in connection with FIGS. 3A-3D.

Figure 3A:
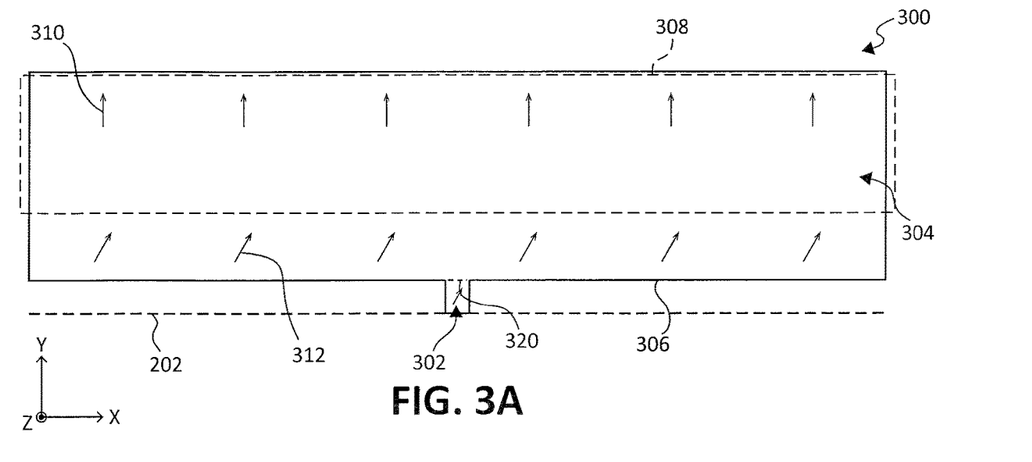
FIGS. 3A-3D are top views of a synthetic antiferromagnetic (SAF) structure showing magnetization directions in a reference layer of the SAF structure.
Figure 3B:
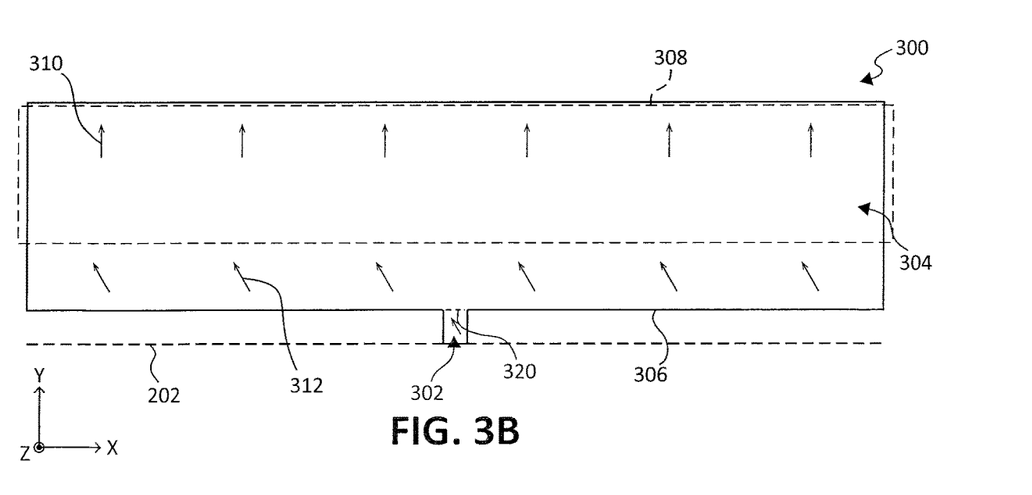

FIGS. 3A-3D are top views of an SAF structure 300 showing different magnetic states. As will be described below in connection with FIG. 4A, an SAF structure includes a bottom pinned layer that is in contact with an AFM layer, a thin separation layer above the pinned layer and a reference layer above the separation layer. The top views of the SAF structure in FIGS. 3A-3D show magnetization directions of the reference layer whose magnetization is anti-parallel to that of the pinned layer. In FIGS. 3A-3D, a reader bearing surface is located at 202. As can be seen in FIGS. 3A-3D, SAF structure 300 includes a narrow portion 302 directly below a reader free layer (not shown in FIGS. 3A-3D) and a wide portion 304 behind the narrow portion 302. A front edge of wide portion 304 of the SAF 300 (proximate to bearing surface 202) is denoted by reference numeral 306. Dashed box 308 represents a location of a recessed AFM that pins a magnetization direction of the SAF 300. As can be seen in FIGS. 3A-3D, a pinning direction of the SAF magnetization (shown by arrows 310) by the recessed AFM 308 is perpendicular to the front edge 306 of the wide portion 304. Because of the AFM 308 recession and thus an absence of the AFM 308 support near and at the front edge 306, SAF magnetization 312 cants (left or right) from the direction perpendicular to the bearing surface and in a plane of the SAF 300. In FIG. 3A, the canting of the SAF magnetization 312 is rightward near the front edge 306 in a first magnetic state. In FIG. 3B, the canting of the SAF magnetization 312 is leftward near the front edge 306 in a second magnetic state.

Figure 3C:
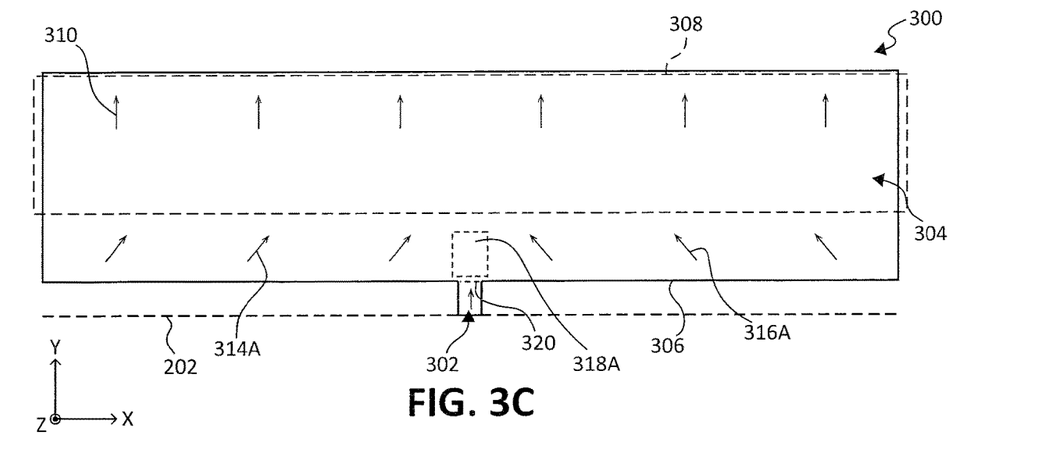
Figure 3D:
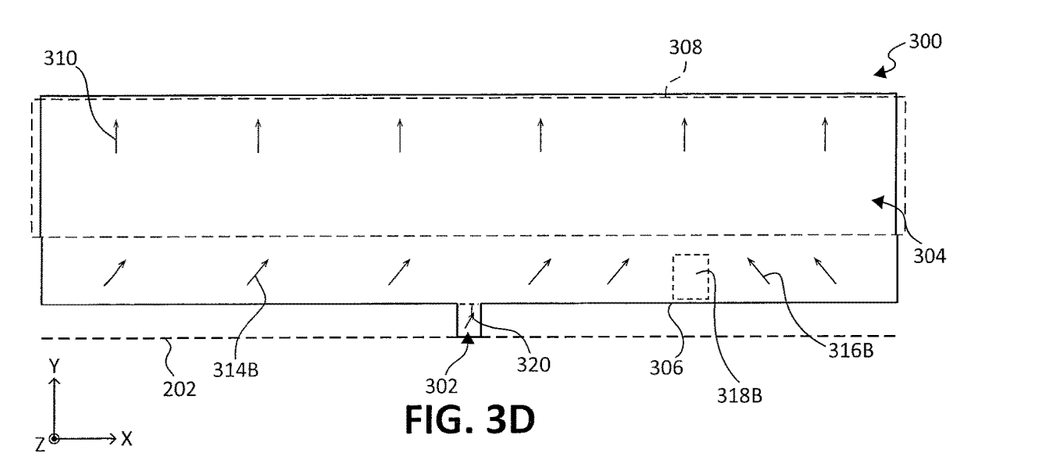

FIG. 3C illustrates a third magnetic state in SAF 300 where the SAF 300 magnetization near the front edge 306 is canted in opposite directions (314A and 316A) near the front edge 306 of SAF 300. In FIG. 3C, a domain wall 318A is located near a sensing part of the reader. In a fourth magnetic state (not shown), 314A may be canted leftward and 316A may be canted rightward. FIG. 3D also illustrates a fifth magnetic state in SAF 300 where the SAF 300 magnetization is canted in opposite directions (314B and 316B) near the front edge 306 of SAF 300. In FIG. 3D, a domain wall 318B is located away from a sensing part of the reader. In a sixth magnetic state (not shown), 314B may be canted leftward and 316B may be canted rightward.

In magnetic states of the type shown in FIGS. 3C and 3D, one or more low-angle domain walls (e.g., 318A, 318B) are formed. The domain wall 318A, 318B, by moving around the sensing position (continuously or in steps), can create different types of noise and instability in the reader. In general, noise- and instability-related problems with a reader that includes a SAF structure such as 300 with the AFM in location 308 may occur because SAF 300 may undergo a change/switch from, for example, any one of the above-described magnetic states to another one of the above-described magnetic states.

Embodiments of the disclosure reduce SAF 300 magnetic noise by stabilizing the magnetic structure (e.g., providing preference to one of the different states) in the wide portion 304 of SAF 300 in the vicinity of a back edge of the free layer (location 320 in FIGS. 3A, 3B and 3C) and, therefore, reduce reader magnetic noise and instability.

In some embodiments described herein, the reader magnetic noise and instability are reduced by intentionally canting the magnetization of the SAF structure at a suitable angle in the wide portion of the SAF structure. In other embodiments, the reader magnetic noise and instability are reduced by forming a suitable protrusion at a front edge of the wide portion of the SAF structure. In still other embodiments, a width of the wide portion of the SAF structure is selected such that the reader magnetic noise and instability are reduced. Different embodiments are described below in connection with FIGS. 4A-4F.

Figure 4A:
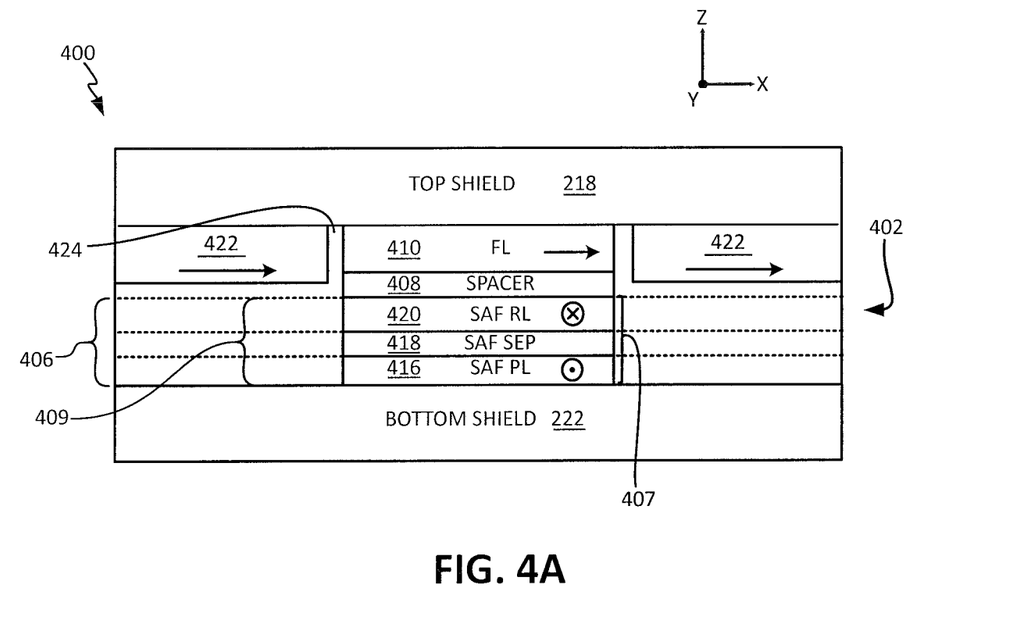
FIG. 4A is a bearing surface view of a reader embodiment.

FIG. 4A is a schematic block diagram illustrating a bearing surface view of an example embodiment of a read head or reader 400 including a wide SAF structure that is configured such that its magnetic noise and instability is reduced. Read head 400 includes a magnetoresistive sensor 402 that is positioned between top shield 218 and bottom shield 222. Top and bottom shields 218 and 222, which may be made of a material having high magnetic permeability, reduce or substantially block extraneous magnetic fields, such as, for example, those from adjacent bits on data discs from impacting the magnetoresistive sensor 402, thus improving the performance of the magnetoresistive sensor 402. In one implementation, the top and bottom shields 218 and 222 permit magnetic fields from the bit directly under magnetoresistive sensor 402 to affect the magnetoresistive sensor 402, and thus be read.

The magnetoresistive sensor 402 includes a plurality of stacked layers including a synthetic antiferromagnetic (SAF) structure 406, a spacer layer 408 and a free layer 410. A stack cap layer (not shown) may also be included above the free layer 310.

In the embodiment shown in FIG. 4A, the sensor SAF structure 406 includes a narrow portion 407 below the free layer 410 and a wide portion 409 behind the narrow portion 407. Both narrow portion 407 and wide portion 409 of the SAF structure 406 include a pinned layer 416 a thin separation layer 418, which may comprise a metal such as ruthenium (Ru) in some embodiments, and a reference layer 420. The magnetic moments of each of the pinned layer 416 and the reference layer 420 are not allowed to rotate under magnetic fields in the range of interest (for example, magnetic fields generated by the bits of data stored on the data discs). In some embodiments, the magnetic moments of the reference layer 420 and the pinned layer 416 are may be oriented substantially normal to the plane (e.g., the y direction) of FIG. 4A and anti-parallel to each other. Such embodiments are shown in FIGS. 4D and 4E and described further below. In other embodiments, the magnetic moments of the reference layer 420 and the pinned layer 416 are anti-parallel and are canted at an angle from the y direction (e.g., at an angle of 13 degrees from the y direction) as shown in FIG. 4C, which is described further below.

In one implementation, the free layer 410 is not exchange coupled to, for example, an antiferromagnet. As a result, the magnetic moment of the free layer 410 is free to rotate under the influence of an applied magnetic field in a range of interest. The read head 400 further includes side shields 422, which produce a magnetic field that biases the free layer 410 with a magnetic moment parallel to the plane of the figure and generally oriented horizontally. This bias prevents the magnetic moment of the free layer 410 from drifting due to, for example, thermal energy, which may introduce noise into the data sensed by the read head 400. The bias is sufficiently small, however, that the magnetic moment of the free layer 410 can change in response to an applied magnetic field, such as a magnetic field of a data bit stored on the data discs. The magnetoresistive sensor 402 is separated and electrically isolated from the side shields 422 by an isolation layer 424 including, for example, insulating materials. Isolation layer 424 may also be present in other regions of head 400.

In some embodiments, sensor 402 may utilize tunnel magnetoresistance (TMR) or giant magnetoresistance (GMR) effects. In embodiments that utilize TMR effects, spacer layer 408 is a tunneling barrier layer that separates the SAF structure 406 from the free layer 410. The tunneling barrier layer 408 is sufficiently thin that quantum mechanical electron tunneling occurs between reference layer 420 in the SAF structure 406 and the free layer 410. The electron tunneling is electron-spin dependent, making the magnetic response of the magnetoresistive sensor 402 a function of the relative orientations and spin polarizations of the SAF structure 406 and the free layer 410. The highest probability of electron tunneling occurs when the magnetic moments of the SAF structure 406 and the free layer 410 are parallel, and the lowest probability of electron tunneling occurs when the magnetic moments of the SAF structure 406 and the free layer 410 are anti-parallel. Accordingly, the electrical resistance of the magnetoresistive sensor 402 changes in response to an applied magnetic field. The data bits on the data discs in the disc drive may be magnetized in a direction normal to the plane of FIG. 4A, either into the plane of the figure, or out of the plane of the figure. Thus, when the magnetoresistive sensor 402 passes over a data bit, the magnetic moment of the free layer 410 is rotated either into the plane of FIG. 4A or out of the plane of FIG. 4A, changing the electrical resistance of the magnetoresistive sensor 402. The value of the bit being sensed by the magnetoresistive sensor 402 (for example, either 1 or 0) may therefore be determined based on the current flowing from a first electrode (not shown) to a second electrode (not shown) connected to the magnetoresistive sensor 402.

Figure 4B:
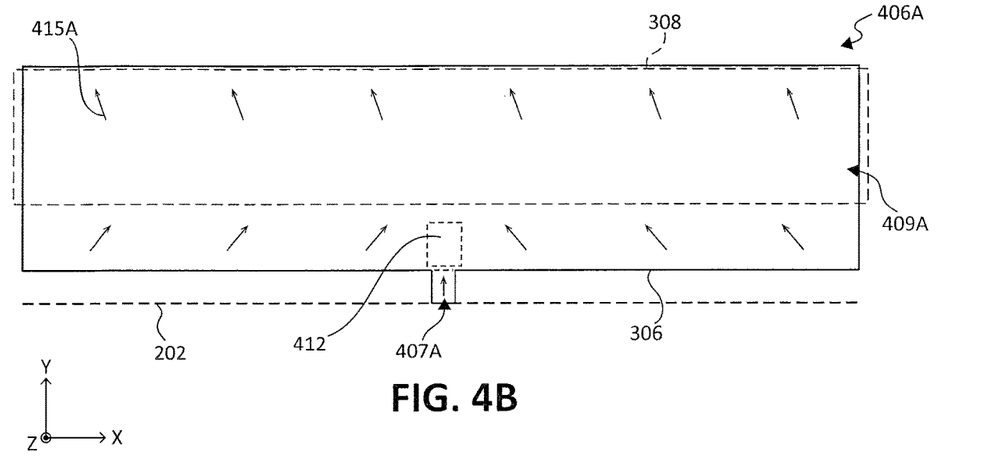
FIG. 4B is a top view of an SAF structure having a pinned canted magnetization.
Figure 4C:
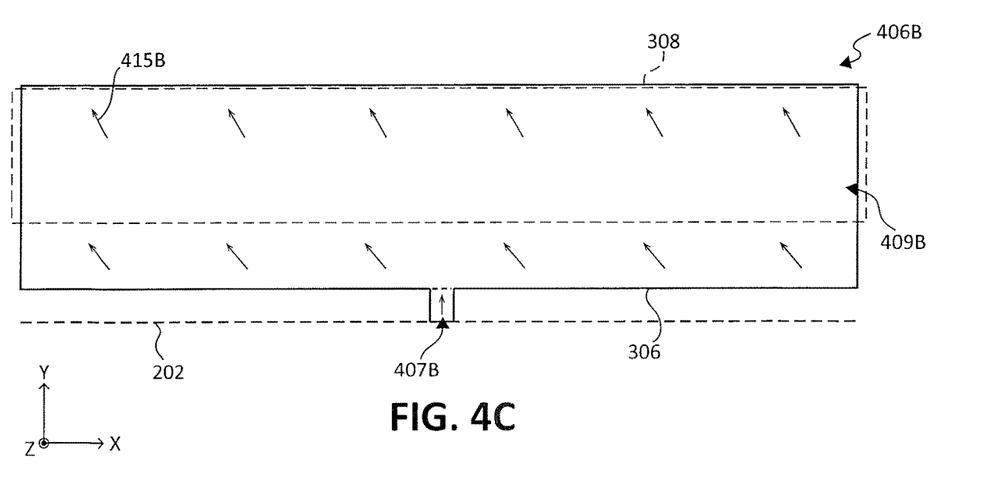
FIGS. 4C-4F are top views of a SAF structures that are suitable for use in the reader embodiment of FIG. 4A.
Figure 4D:
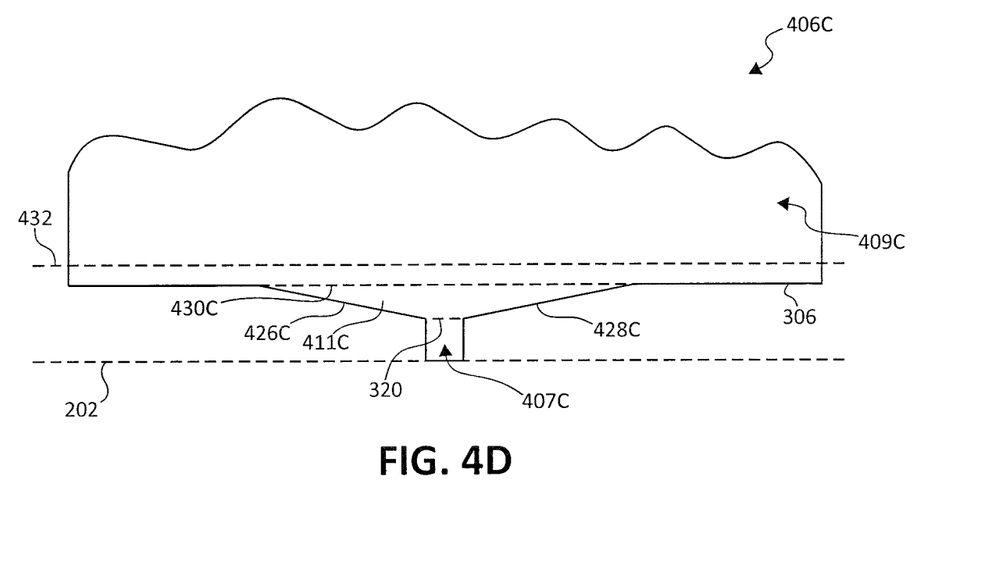
Figure 4E:
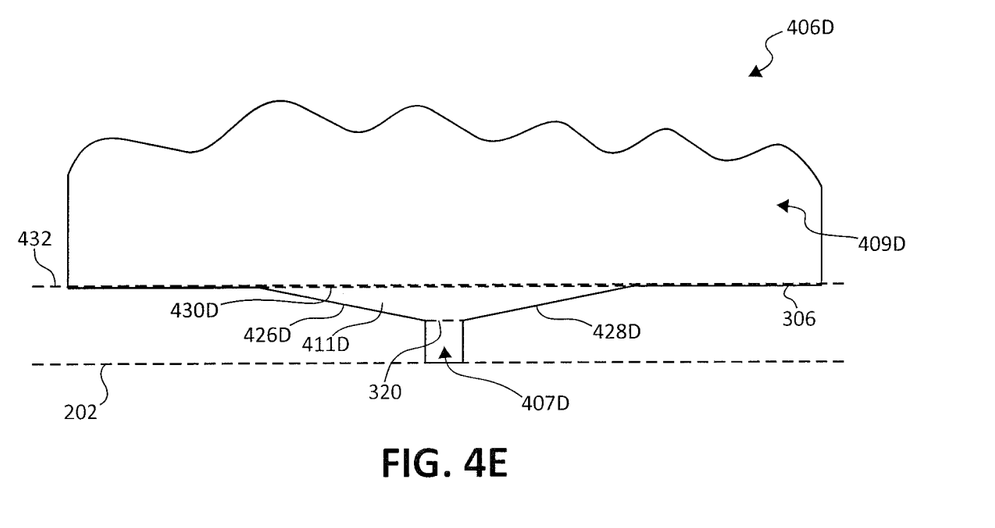

FIGS. 4B and 4C are top views of SAF structures 406A and 406B, respectively, with canted SAF magnetization pinning. As in the case of FIGS. 3A, 3B and 3C, magnetizations of the reference layer 420 are shown in the FIGS. 4B and 4C. Each SAF structure 406A, 406B has a narrow portion 407A, 407B and a wide portion 409A, 409B. Both wide SAF 409A and 409B have their magnetizations 415A and 415B, respectively, pinned by AFMs 308. Each SAF magnetization 415A, 415B, in a plane of the SAF 406A, 406B, is canted left from the direction perpendicular to the bearing surface (e.g., left with respect to the y direction). Canted pinning of the wide SAF portion 409A, 409B gives an energy preference to the SAF magnetization 415A, 415B in one direction (e.g., left in FIGS. 4B and 4C) versus the other direction (e.g., right). In FIG. 4B, the canting angle (e.g., 12 degrees from the y direction) is insufficient to eliminate a domain wall 412. However, the canting angle (e.g., 13 degrees from the y direction) in FIG. 4C preserves a single magnetic state that remains unchanged when there are thermal fluctuations. Thus, the magnetization of wide SAF portion 409 of the SAF structure 406 of FIG. 4A may be pinned with the suitable canting angle in FIG. 4C. In general, the canting angle at which stability of the magnetic state is achieved depends on thicknesses of magnetic layers (pinned layer 416 and reference layer 420) of the SAF structure 406, magnetic moments of the pinned layer 416 and the reference layer 420, and a recession of the AFM layer (e.g., a distance of a front of the AFM layer from the bearing surface).

FIGS. 4D and 4E are top views of SAF structures 406C and 406D, respectively, in which substantially triangular or curved protrusions are included at front edges of wide portions of the SAF structures 406C and 406D. Each SAF structure 406C, 406D has a narrow portion 407C, 407D and a wide portion 409C, 409D. In SAF structures 406C and 406D, the magnetizations of wide SAF portions 409C and 409D, respectively, may not be canted and thus may coincide with the y direction in some embodiments. In other embodiments, the magnetizations of wide SAF portions 409C and 409D may be canted in a manner shown in FIG. 4C. As can be seen in FIGS. 4D and 4E, substantially triangular or curved protrusions 411C and 411D, respectively, are included between respective narrow 407C, 407D and wide 409C, 409D SAF portions. The protrusion 411C, 411D may be centered relatively to narrow portion 407C, 407D of SAF structure 406C, 406D under the free layer (not shown in FIGS. 4D and 4E). The magnetic structure is stabilized inside the protruding areas 411C and 411D due to demagnetizing fields from sloped edges 426C and 428C in FIG. 4D and 426D and 428D in FIG. 4E, respectively. The protruding area 411C, 411C thus prevents magnetic state switching, and accordingly reduces reader noise.

In some embodiments, the front edge 306 of the wide SAF portion 409C, 409D does not cross (e.g., is not behind) a recession line (e.g., front edge 432 of AFM 308) to avoid complicating a geometry between recessed and main stack portions of the read sensor, which may complicate magnetics of the stack portions. In the embodiment of FIG. 3D, a distance between the front edge 306 of wide SAF portion 409C, which coincides with a base 430C of protrusion 411C, and the bearing surface 202 is less than a distance between the front edge 432 of the AFM 308 and the bearing surface 202. In the embodiment of FIG. 3E, the front edge 306 of wide SAF portion 409D, which coincides with a base 430D of protrusion 411D, coincides with the front edge 432 of the AFM 308. SAFs 406C or 406D may be used as SAF 406 in reader 402 of FIG. 4A.

Figure 4F:
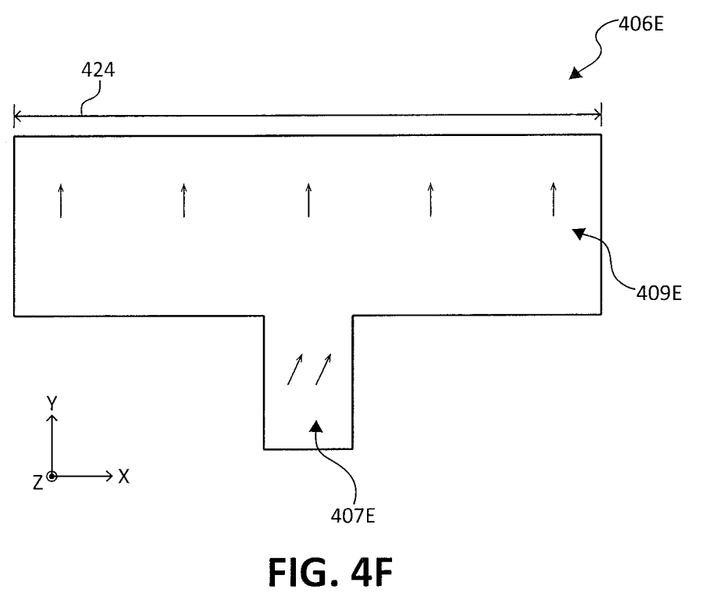

FIG. 4F is a top view of a SAF structures 406E in accordance with another embodiment. SAF structure 406E has a narrow portion 407E and a wide portion 409E. It is found that, if wide portion 409E is narrowed down so that it is still wider than the free layer, which has a width that corresponds to a width of narrow portion 409E, but is narrower than 200-300 nm, the demagnetization fields from side edges of wide portion 409E will stabilize the SAF 306E, thereby preserving a single magnetic state that remains unchanged when there are thermal fluctuations. This reduces reader noise. In the embodiment of FIG. 4F a width 424 of wide SAF portion 409E is 150 nanometers (nm) and has one stable state. In general, the wide portion 409E of the SAF structure 406E may have a width that is less than 300 nm and greater than a width of the narrow portion 407E of the SAF structure 406E. In some embodiments, the magnetization of the wide portion 409E may be pinned such that it is in the y direction. In other embodiments, the magnetization of the wide portion 409E may be canted in a manner shown in FIG. 4C.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A reader comprising:
   a bearing surface;
   a free layer having a front surface that forms a portion of the bearing surface;
   a synthetic antiferromagnetic (SAF) structure below the free layer, the SAF structure having a narrow portion having a front surface that forms a portion of the bearing surface and a wide portion behind the narrow portion; and
   an antiferromagnetic (AFM) layer in contact with the wide portion of the SAF structure,
   wherein the SAF structure is configured to prevent switching from one magnetic state to another magnetic state in the wide portion by having a magnetization of the wide portion in contact with the AFM layer pinned by the ARA layer in a plane of the SAF structure at an angle with respect to an axis perpendicular to the bearing surface.

2. The reader of claim 1 and wherein the SAF structure comprises a pinned layer and a reference layer, and wherein magnetizations of the reference layer and the pinned layer are anti-parallel and at the angle with respect to the axis perpendicular to the bearing surface.

3. The reader of claim 1, and wherein a degree value of the angle is dependent upon thicknesses of magnetic layers of the SAF structure.

4. The reader of claim 1 and wherein the SAF structure further comprises a protrusion from the wide portion, the protrusion comprises a base in contact with a front edge of the wide portion of the SAF structure and a front edge in contact with a rear edge of the narrow portion of the SAF structure, the base having a width that is less than a width of the wide portion of the SAF structure and greater that a width of the front edge of the projection.

5. The reader of claim 4 and wherein a separation distance between the front edge of the wide portion of the SAF structure and the bearing surface is less than a separation distance between a front edge of the AFM layer and the bearing surface.

6. The reader of claim 4 and wherein a separation distance between the front edge of the wide portion of the SAF structure and the bearing surface is substantially equal to a separation distance between a front edge of the AFM layer and the bearing surface.

7. The reader of claim 1 and wherein the protrusion further comprises a first sloped edge that connects a first end of the base of the protrusion to a first end of the front edge of the protrusion, and a second sloped edge that connects a second end of the base of the protrusion to a second end of the front edge of the protrusion.

8. The reader of claim 1 and wherein a width of the wide portion of the SAF structure is less than 300 nanometers and greater than a width of the narrow portion of the SAF structure, the width of the narrow portion of the SAF structure corresponding to a width of the free layer.

9. A method of forming a reader, the method comprising:
   providing a bearing surface;
   providing a free layer having a front surface that forms a portion of the bearing surface;
   providing a synthetic antiferromagnetic (SAF) structure below the free layer, the SAF structure having a narrow portion having a front surface that forms a portion of the bearing surface and a wide portion behind the narrow portion;
   providing an antiferromagnetic (AFM) layer in contact with the wide portion of the SAF structure; and
   preventing switching from one magnetic state to another magnetic state in the wide portion of the SAF structure by:
      pinning a magnetization of the wide portion of the SAF structure in contact with the AFM layer in a plane of the SAF structure and at an angle with respect to an axis perpendicular to the bearing surface; or
      providing a protrusion from the wide portion the SAF structure, the protrusion comprising a base in contact with a front edge of the wide portion of the SAF structure and a front edge in contact with a rear edge of the narrow portion of the SAF structure, the base having a width that is less than a width of the wide portion of the SAF structure and greater than a width of the front edge of the protrusion wherein a separation distance between the front edge of the wide portion of the SAF structure and the bearing surface is less than a separation distance between a front edge of the AFM layer and the hearing surface.

10. The method of claim 9 wherein providing the protrusion further comprises providing a first sloped edge that connects a first end of the base of the protrusion to a first end of the front edge of the protrusion, and providing a second sloped edge that connects a second end of the base of the protrusion to a second end of the front edge of the protrusion.

11. The method of claim 9 and further comprising providing the wide portion of the SAF structure with a width that is less than 300 nanometers and greater than a width of the narrow portion of the SAF structure, the width of the narrow portion of the SAF structure corresponds to a width of the free layer.

12. The method of claim 9 and wherein a degree value of the angle is dependent upon thicknesses of magnetic layers of the SAF structure.

13. A reader comprising:
   a bearing surface;
   a free layer having a front surface that forms a portion of the bearing surface;
   a synthetic antiferromagnetic (SAF) structure below the free layer, the SAF structure having a narrow portion having a front surface that forms a portion of the bearing surface and a wide portion behind the narrow portion;
   an antiferromagnetic (AFM) layer in contact with the wide portion of the SAF structure; and
   a protrusion from the wide portion the SAF structure, the protrusion comprising a base in contact with a front edge of the wide portion of the SAF structure and a front edge in contact with a rear edge of the narrow portion of the SAF structure, the base having a width that is less than a width of the wide portion of the SAF structure and greater than a width of the front edge of the protrusion, wherein a separation distance between the front edge of the wide portion of the SAF structure and the bearing surface is less than a separation distance between a front edge of the AFM layer and the bearing surface.

14. The reader of claim 13 and wherein the protrusion further comprises a first sloped edge that connects a first end of the base of the protrusion to a first end of the front edge of the protrusion, and a second sloped edge that connects a second end of the base of the protrusion to a second end of the front edge of the protrusion.

15. The reader of claim 14 and wherein a magnetization within the protrusion is stabilized by demagnetizing fields emanating from the first and second sloped edges.

16. The reader of claim 14 and wherein the first sloped edge and the second sloped edge have a substantially same length.

17. The reader of claim 14 and wherein a magnetization of the wide portion of the SAF structure in contact with the AFM layer is pinned by the AFM layer in a plane of the SAF structure and at an angle with respect to an axis perpendicular to the bearing surface.

18. The reader of claim 17 and wherein a degree value of the angle is dependent upon thicknesses of magnetic layers of the SAF structure.

19. The reader of claim 17 and wherein a degree value of the angle is dependent upon the separation distance between a front edge of the AFM layer and the bearing surface.

20. The reader of claim 13 and wherein the protrusion is configured to preventing the switching from one magnetic state to another magnetic state in the wide portion of the SAF structure.

* * * * *

UNITED STATES PATENT AND TRADEMARK OFFICE
CERTIFICATE OF CORRECTION

PATENT NO. : 11,423,929 B1
APPLICATION NO. : 17/392627
DATED : August 23, 2022
INVENTOR(S) : Victor Sapozhnikov et al.

It is certified that error appears in the above-identified patent and that said Letters Patent is hereby corrected as shown below:

In the Claims

Column 9, Claim 1, Line 35, please replace the word "ARA" with the word --AFM--.

Column 10, Claim 9, Line 26, please insert the word --of-- between the words "portion" and "the".

Column 10, Claim 9, Line 37, please replace the word "hearing" with the word --bearing--.

Column 10, Claim 13, Line 65, please insert the word --of-- between the words "portion" and "the".

Signed and Sealed this
Twenty-second Day of November, 2022

*Katherine Kelly Vidal*

Katherine Kelly Vidal
*Director of the United States Patent and Trademark Office*